United States Patent
Chang et al.

(10) Patent No.: US 11,329,017 B2
(45) Date of Patent: May 10, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Wei-Tung Chang, Kaohsiung (TW); Cheng-Nan Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/862,455

(22) Filed: Apr. 29, 2020

(65) Prior Publication Data

US 2021/0343664 A1 Nov. 4, 2021

(51) Int. Cl.
*H01L 23/66* (2006.01)
*H01Q 1/22* (2006.01)
*H01L 23/48* (2006.01)

(52) U.S. Cl.
CPC ............ *H01L 23/66* (2013.01); *H01L 23/481* (2013.01); *H01Q 1/2283* (2013.01); *H01L 2223/6677* (2013.01)

(58) Field of Classification Search
CPC ..... H01Q 1/2283; H01L 23/66; H01L 23/481; H01L 2223/6677
See application file for complete search history.

(56) References Cited

U.S. PATENT DOCUMENTS

| 7,944,038 B2 * | 5/2011 | Chiu | H01L 23/3128 257/690 |
| 8,648,454 B2 | 2/2014 | Liu et al. | |
| 2006/0290505 A1 * | 12/2006 | Conwell | G06K 19/0776 340/572.1 |
| 2007/0069036 A1 * | 3/2007 | Baba | G06K 19/07728 235/492 |
| 2013/0207274 A1 * | 8/2013 | Liu | H01Q 1/2283 257/774 |

\* cited by examiner

*Primary Examiner* — Robert G Bachner
(74) *Attorney, Agent, or Firm* — Foley & Lardner LLP

(57) ABSTRACT

The present disclosure provides a semiconductor device package. The semiconductor device package includes a first electronic component having an active surface and a backside surface opposite to the active surface and a first antenna layer disposed on the backside surface of the first electronic component. The semiconductor device package further includes a first dielectric layer covering the first antenna layer and a second antenna layer disposed over the first antenna layer. The second antenna layer is spaced apart from the first antenna layer by the first dielectric layer. A method of manufacturing a semiconductor device package is also disclosed.

15 Claims, 10 Drawing Sheets

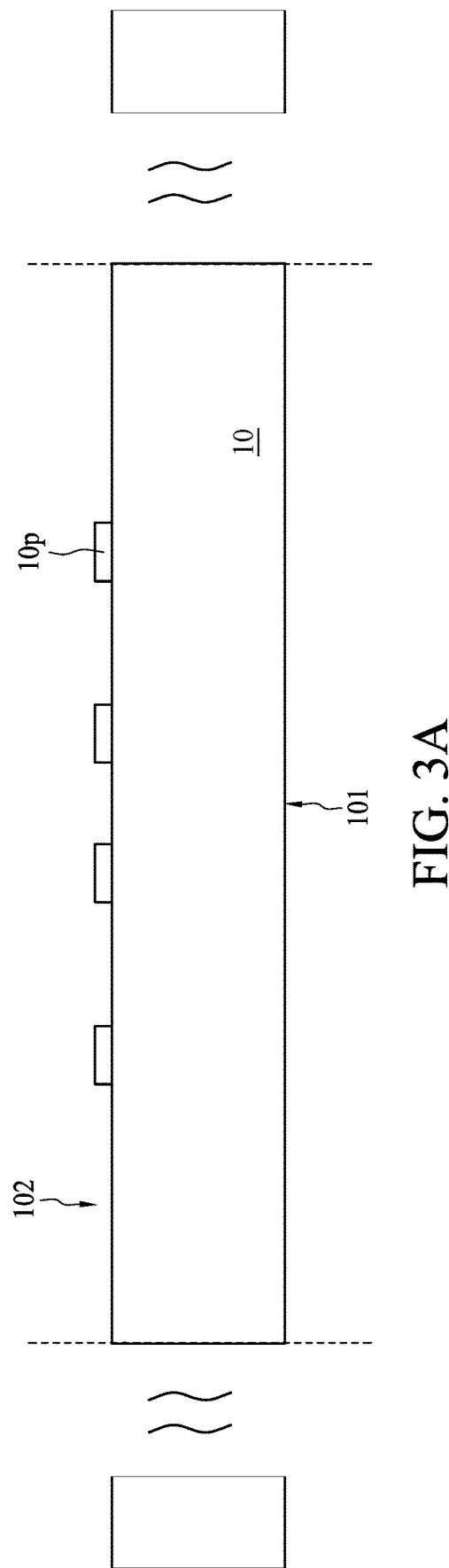

SEMICONDUCTOR DEVICE PACKAGE AND METHOD OF MANUFACTURING THE SAME

BACKGROUND

1. Technical Field

The present disclosure generally relates to a semiconductor device package and a method of manufacturing the same and, in particular, to a semiconductor device package with an antenna layer.

2. Description of the Related Art

Wireless communication devices such as mobile phones may include semiconductor device package(s) having antennas for signal (e.g. radio frequency (RF) signals) transmission. As operating frequency increases (e.g. equal to or greater than 28 GHz), a resonant cavity (e.g. a height or a distance) between antennas must be wider in order to achieve frequency agility and improve bandwidth. However, an increase in the above-mentioned distance would inevitably increase package size, and the problem of heat dissipation may become severe.

SUMMARY

In one or more embodiments, the present disclosure provides a semiconductor device package. The semiconductor device package includes a first electronic component having an active surface and a backside surface opposite to the active surface and a first antenna layer disposed on the backside surface of the first electronic component. The semiconductor device package further includes a first dielectric layer covering the first antenna layer and a second antenna layer disposed over the first antenna layer. The second antenna layer is spaced apart from the first antenna layer by the first dielectric layer.

In one or more embodiments, the present disclosure provides a semiconductor device package. The semiconductor device package includes an electronic component having an active surface and a backside surface and an antenna pattern disposed directly on the backside surface of the electronic component. The semiconductor device package further includes a dielectric layer disposed on the backside surface of the electronic component and covering the antenna pattern.

In one or more embodiments, the present disclosure provides a method of manufacturing a semiconductor device package. The method includes providing an electronic component having an active surface and a backside surface opposite to the active surface. The method further includes forming an antenna layer on the backside surface of the electronic component and forming a dielectric layer on the backside surface of the electronic component to cover the antenna layer.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 3A illustrates one or more stages of a method of manufacturing a substrate structure in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
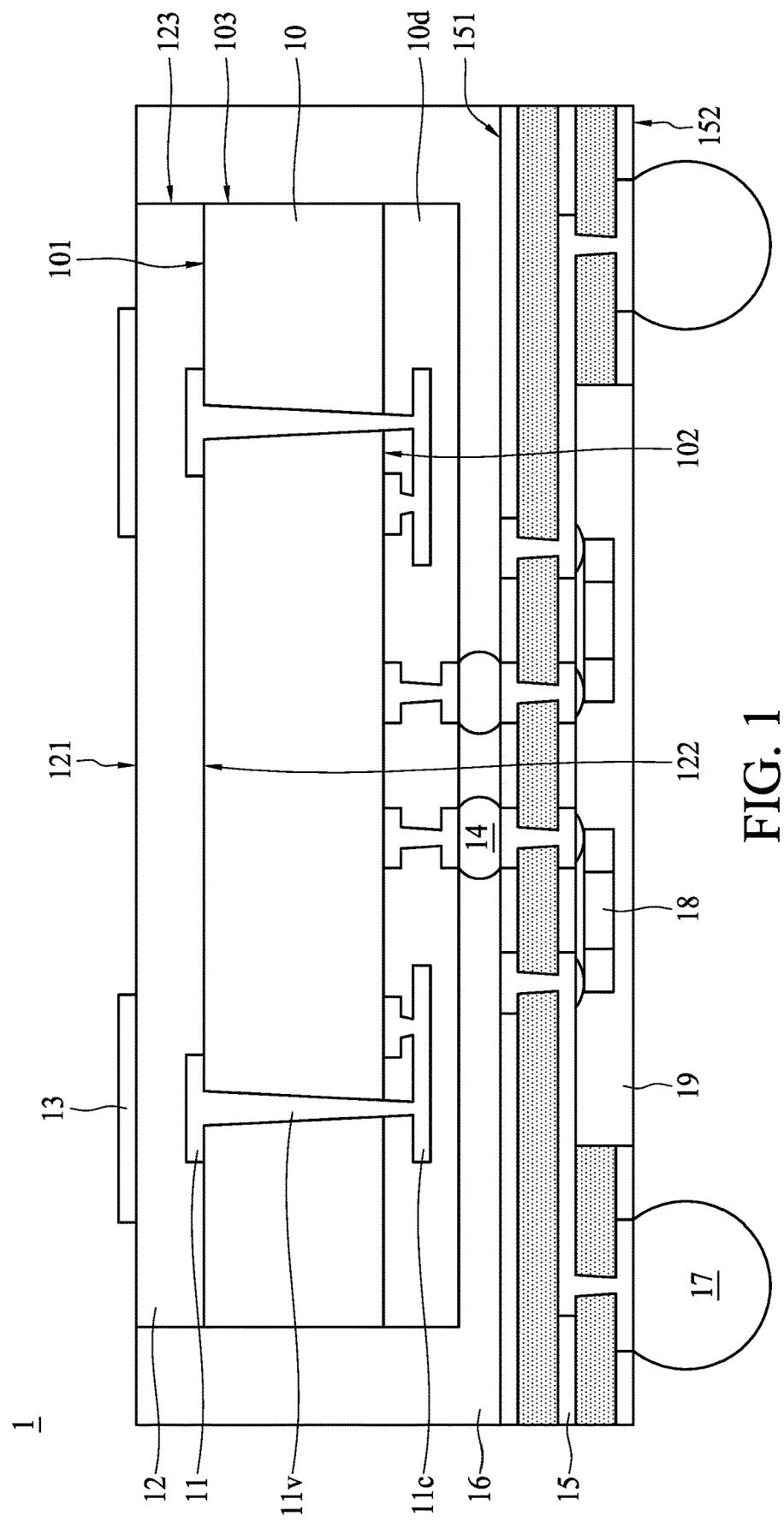
FIG. 1 is a cross-sectional view of a semiconductor device package, in accordance with an embodiment of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a semiconductor device package 1, in accordance with an embodiment of the present disclosure. The semiconductor device package 1 includes electronic components 10 and 18, antenna layers 11 and 13, a dielectric layer 12, electrical contacts 14 and 17, an interconnection structure 15, and a package body 16.

The electronic component 10 may include, for example, a printed circuit board, such as a paper-based copper foil laminate, a composite copper foil laminate, or a polymer-impregnated glass-fiber-based copper foil laminate. The electronic component 10 may include an active component, such as an integrated circuit (IC) chip or a die. The electronic component 10 may include, for example but is not limited to, silicon (Si), gallium arsenide (GaAs), glass or other suitable material. In some embodiments, the electronic component 10 may be a semiconductor wafer or panel, such as a silicon wafer, and includes a plurality of semiconductor chips.

The electronic component 10 includes a surface 101, a surface 102 opposite to the surface 101, and a surface 103 extending between the surface 101 and surface 102. In some embodiments, the surface 102 is an active surface and the surface 101 is a passive surface or a backside surface. A plurality of conductive elements 11c may be in proximity to the surface 102, adjacent to the surface 102, embedded in the surface 102, and/or partially exposed from the surface 102. The conductive elements 11c are disposed closer to the surface 102 than to the surface 101. In some embodiments, the conductive elements 11c include a fan-out structure.

Examples of the conductive elements 11c may include, for example, conductive pads, conductive pillars, solder bumps, grounding elements, radio frequency (RF) routing layer, and the likes. The electronic component 10 may include a passivation layer 10d on the surface 102 to fully expose or to expose at least a portion of the conductive elements 11c for electrical connections. In some embodiments, a surface of the passivation layer 10d is substantially coplanar with the surface 103 of the electronic component 10.

The antenna layer 11 is disposed on the surface (i.e., the passive surface or the backside surface) 101 of the electronic component 10. In some embodiments, the antenna layer 11 is directly disposed on the surface 101 of the electronic component 10. For example, the antenna layer 11 is in direct contact with the surface 101 of the electronic component 10.

In some embodiments, the antenna layer 11 is substantially coplanar. For example, the antenna layer 11 has a level or flat surface without raised areas or indentations. For example, the antenna layer 11 is substantially leveled with the surface 101 of the electronic component 10.

In some embodiments, the antenna layer 11 may be a patch antenna. In some embodiments, the antenna layer 11 may include a conductive material such as a metal or metal alloy. Examples of the conductive material include gold (Au), silver (Ag), aluminum (Al), copper (Cu), or an alloy thereof In some embodiments, the antenna layer 11 may also be referred to as an antenna pattern.

The antenna layer 11 on the surface 101 is electrically connected to the conductive elements 11c on the surface 102 through a through via 11v. In some embodiments, the through via 11v may be a feeding line. In some embodiments, the through via 11v may provide a signal to the antenna layer 11. For example, the signal may be transmitted between the conductive elements 11c, the through via 11v and the antenna layer 11. The through via 11v passes through the electronic component 10. For example, the through via 11v penetrates from the surface 101 of the electronic component 10 to the surface 102 of the electronic component 10.

The dielectric layer 12 is disposed on the surface 101 of the electronic component 10 and covers the antenna layer 11. The antenna layer 11 is disposed within the dielectric layer 12. For example, the antenna layer 11 is encapsulated, covered, or surrounded by the dielectric layer 12.

The dielectric layer 12 includes a surface 121, a surface 122 opposite to the surface 121, and a surface 123 extending between the surface 121 and 122. The surface 122 of the dielectric layer 12 is in contact with the antenna layer 11 and the surface 101 of the electronic component 10. The surface 121 of the dielectric layer 12 is in contact with the antenna layer 13. In some embodiments, the surface 123 of the dielectric layer 12 is substantially coplanar with the surface 103 of the electronic component 10.

In some embodiments, the dielectric layer 12 may include, for example but is not limited to, a polytetrafluoroethylene (PTFE), a polyimide (PI), a polyphenylene ether (PPE), a polystyrene (PS), any combination thereof, or other suitable materials. In some embodiments, the dielectric layer 12 may include a ceramic material. In some embodiments, the dielectric layer 12 may include a material different from the electronic component 10.

In some embodiments, the dielectric constant (Dk) of the dielectric layer 12 is lower than the dielectric constant of the electronic component 10. In some embodiments, the dielectric constant of the dielectric layer 12 is lower than about 4.0. In some embodiments, the dielectric constant of the dielectric layer 12 is between about 1.0 and about 4.0, such as about 3.5.

The arrangement of the antenna layer 11 on the surface 101 of the electronic component 10 according to the present disclosure can be referred to as an antenna on chip (AoC) structure. The height or thickness of the electronic component 10 measured between the surface 101 and the surface 102 defines a resonant cavity between the antenna layer 11 and a reference layer or a grounding layer (which is positioned on the surface 102 of the electronic component 10). The dielectric layer 12 with a lower dielectric constant (such as lower than the dielectric constant of the electronic component 10) helps achieve frequency agility and improve bandwidth of the antenna layer 11.

In comparison with a comparative embodiment where an antenna layer is disposed on an active surface of an electronic component, heat generated from the electronic component 10 can be dissipated through the surface (i.e., the active surface) 102 without being blocked by the antenna layer 11. In addition, since the electrical interconnection or signal transmission can be accomplished through the electrical contact 14 provided on the surface 102 of the electronic component 10, the electrical interconnection or signal transmission therein can be facilitated.

The antenna layer 13 is disposed on the dielectric layer 12. The antenna layer 13 is in contact with the dielectric layer 12. The antenna layer 13 is disposed over the antenna layer 11. The antenna layer 13 is spaced apart from the antenna layer 11 by the dielectric layer 12.

In some embodiments, the antenna layer 13 is partially overlapped with the antenna layer 11 in a direction substantially perpendicular to the surface 102 (or the surface 101) of the electronic component 10. For example, a projected area of the antenna layer 13 is partially overlapped with a projected area of the antenna layer 11. In some embodiments, a projected area of the antenna layer 13 may be equal to or greater than a projected area of the antenna layer 11.

Similarly, in some embodiments, the antenna layer 13 is substantially coplanar. In some embodiments, the antenna layer 13 may be a patch antenna.

In the embodiments, signals can be transmitted between the antenna layer 13 and the antenna layer 11 through coupling. In some embodiments, the semiconductor device package 1 may only include the antenna layer 11, and the antenna layer 13 may be omitted. In some embodiments, in comparison with the embodiments only having the antenna layer 11, the embodiments having the antenna layer 11 and the antenna layer 13 can achieve a higher frequency wireless transmission.

The interconnection structure 15 is electrically connected with the electronic component 10 through the electrical contact 14. The interconnection structure 15 includes a surface 151 facing the surface 102 of the electronic component 10 and a surface 152 opposite to the surface 151. The electrical contact 14 is provided on the surface 151. The electrical contact 17 and the electronic component 18 are provided on the surface 152.

The interconnection structure 15 may include, for example, an interconnection layer (e.g., redistribution layer, RDL) and a dielectric layer. A portion of the interconnection layer is covered or encapsulated by the dielectric layer while another portion of the interconnection layer is exposed from the dielectric layer to provide electrical connections for the electronic component 10 and the electronic component 18.

The electronic component 18 is electrically connected with the conductive elements 11c on the surface 102 of the electronic component 10 through the electrical contact 14 and the interconnection structure 15.

In some embodiments, the electronic component 18 may include a passive electrical component, such as a capacitor, a resistor or an inductor. In some embodiments, the electronic component 18 may include multiple discrete components. In some embodiments, the electronic component 18 may include an integrated passive device (IPD) or an integrated passive component (IPC), in which electronic components (such as resistors, capacitors, inductors/coils, microstriplines, impedance matching elements or any combinations thereof) are integrated as a package. In some embodiments, the electronic component 18 may function as an impedance matching device for matching the input/output impedance of the antenna layer 11 and/or the antenna layer 13. In some embodiments, the electronic component 18 may function as a decoupling capacitor to suppress the undesired noise.

In some embodiments, as shown in FIG. 1, the interconnection structure 15 defines a cavity on the surface 152 and the electronic component 18 is disposed in the cavity. The cavity is defined within the interconnection structure 15. The cavity is recessed from the surface 152 into the surface 151. In some embodiments, the depth of the cavity is equal to or greater than the height of the highest or thickest electronic component 18 mounted on the surface 152, so as to prevent the electronic component 18 from damage.

The package body 16 is disposed on the surface 151 of the interconnection structure 15 and surrounds the electronic component 10. The package body 16 covers or surrounds the surface 103 of the electronic component 10. The package body 16 is disposed between the surface 102 of the electronic component 10 and the surface 151 of the interconnection structure 15.

The package body 16 may include, for example, an epoxy resin having fillers, a molding compound (e.g., an epoxy molding compound or other molding compound), a polyimide, a phenolic compound or material, a material with a silicone dispersed therein, or a combination thereof.

In some embodiments, the amount of the fillers in the package body 16 may affect the thermal conductivity of the package body 16. For example, the package body 16 has a better ability to transfer heat than an underfill since the amount of the fillers in the package body 16 is greater than the amount of the fillers in an underfill. In some embodiments, the package body 16 covering the surface 102 of the electronic component 10 can help dissipate heat generated from the electronic component 10.

In some embodiments, the roughness of a top surface (such as the surface facing away from the interconnection structure 15) of the package body 16 is greater than the roughness of the surface 101 of the electronic component 10. For example, the roughness average (Ra) of the package body 16 is about 1.0 micrometers (μm) to about 3.0 μm, and the Ra of the package body 16 subjected to a grinding operation is about 0.4 μm to about 0.8 μm. However, the Ra of the surface 101 of the electronic component 10 is less than 0.08 μm.

In addition, the adhesion of the antenna layer 11 to the package body 16 is weaker than the adhesion of the antenna layer 11 to the surface 101 of the electronic component 10.

In a comparative embodiment, the antenna layer (such as the antenna layer 11) may be disposed on the package body (such as the package body 16) which may have a relatively rough surface compared to the electronic component 10. A seed layer may be essential to increase the adhesion of the antenna layer to the package body. The relatively rough surface of the package body and the seed layer may both worsen the antenna performance of the antenna layer.

By comparison, in the present disclosure, the antenna layer 11 is disposed on the surface 101 of the electronic component 10 and spaced apart from the package body 16, which helps enhance the antenna performance of the antenna layer 11. In addition, the antenna layer 11 can be disposed on the surface 101 of the electronic component 10 without a seed layer.

Figure 2:
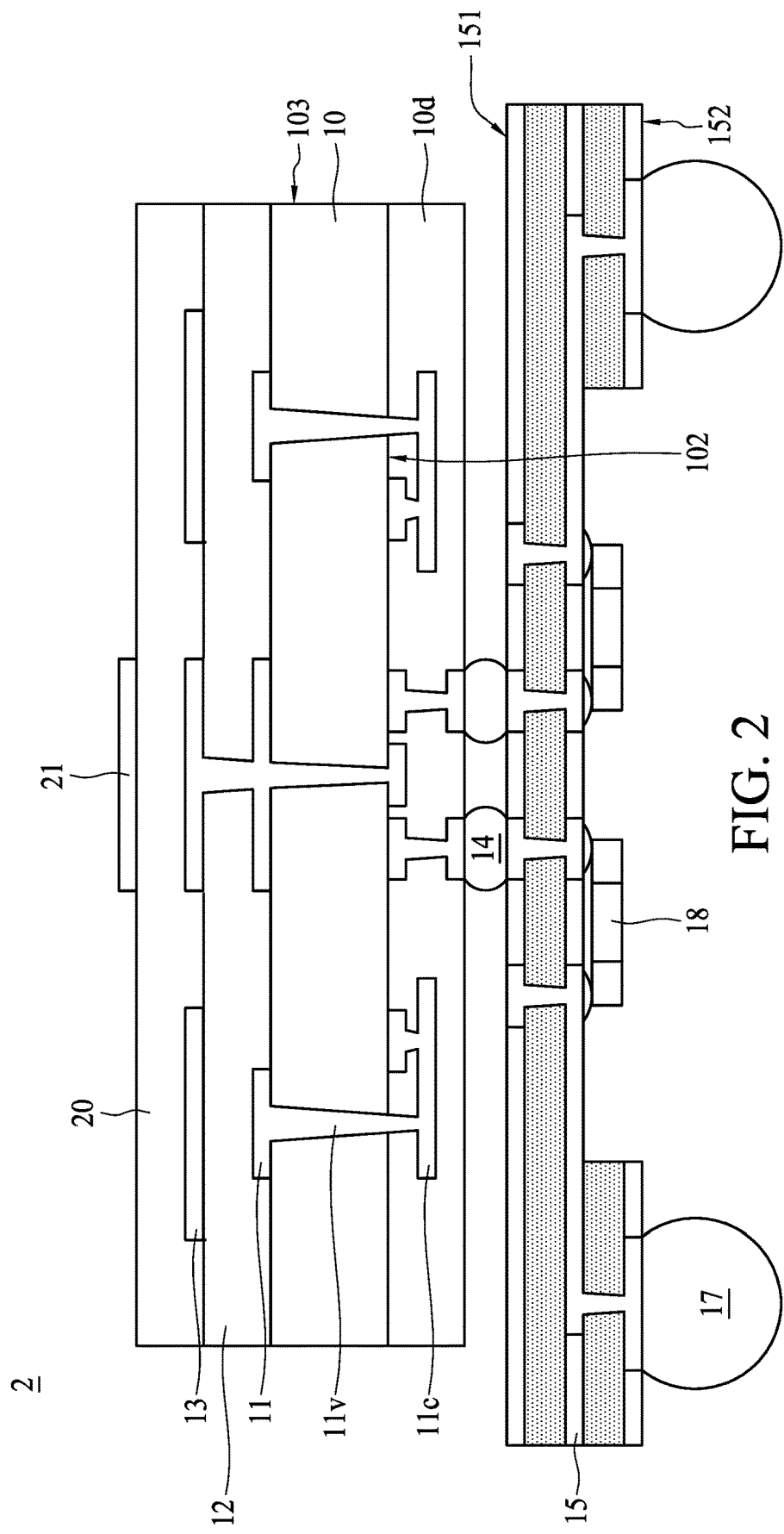
FIG. 2 is a cross-sectional view of a semiconductor device package, in accordance with another embodiment of the present disclosure.

FIG. 2 is a cross-sectional view of a semiconductor device package 2, in accordance with an embodiment of the present disclosure. The semiconductor device package 2 in FIG. 2 is similar to the semiconductor device package 1 in FIG. 1, and the differences therebetween are described below.

The semiconductor device package 2 further includes a dielectric layer 20 disposed on the dielectric layer 12 and covers the antenna layer 13. An antenna layer 21 is disposed on the dielectric layer 20 and is overlapped with the antenna layer 13. The semiconductor device package 2 is a dual-band antenna structure or a dual-frequency antenna structure, such as an antenna structure for 28/39 GHz.

The number of layer(s) of the antenna layers and the dielectric layers illustrated in the figures is for illustrative purposes only, and the present disclosure is not limited thereto. There can be any number of layer(s) of the antenna layers and the dielectric layers in the semiconductor device package according to the present disclosure based on design rules or requirements. For example, there may be other dielectric layers and other antenna layers disposed over the dielectric layer 20.

In some embodiments, the dielectric constant of the dielectric layer 20 is different than the dielectric constant of the dielectric layer 12. In some embodiments, the dielectric constant of the dielectric layer 20 is lower than the dielectric constant of the dielectric layer 12. In some embodiments, the dielectric layer 20 has a greater coefficient of thermal expansion (CTE) than the dielectric layer 12. The greater CTE of the dielectric layer 20 can help balance the stress introduced from the passivation layer 10d on the surface 102 and help mitigate warpage. For example, since the dielectric layer 20 and the passivation layer 10d disposed on opposite sides of the electronic component 10 both have greater CTE than the other layers located inside, the stress can be balanced and the warpage issue in the manufacturing process can be solved.

FIG. 3A, FIG. 3B, FIG. 3C, FIG. 3D, FIG. 3E, FIG. 3F, FIG. 3G, and FIG. 3H are cross-sectional views of a semiconductor device package at various stages of fabrication, in accordance with some embodiments of the present disclosure. At least some of these figures have been simplified for a better understanding of the aspects of the present disclosure.

Referring to FIG. 3A, an electronic component 10 is provided. The electronic component 10 includes a surface (or a passive surface or a backside surface) 101, a surface (or an active surface) 102 opposite to the surface 101, and a surface (such as the surface 103 as shown in FIG. 1) extending between the surface 101 and surface 102. Conductive pad 10p is provided on the surface 102.

In some embodiments, the electronic component 10 may be a semiconductor wafer (a panel or a substrate), which includes several units that one may be separable from another by a scribe line. Since each of the units is subjected to similar or identical processes in the manufacturing method, for convenience, only an exemplary unit is illustrated and described in the following description.

Figure 3B:
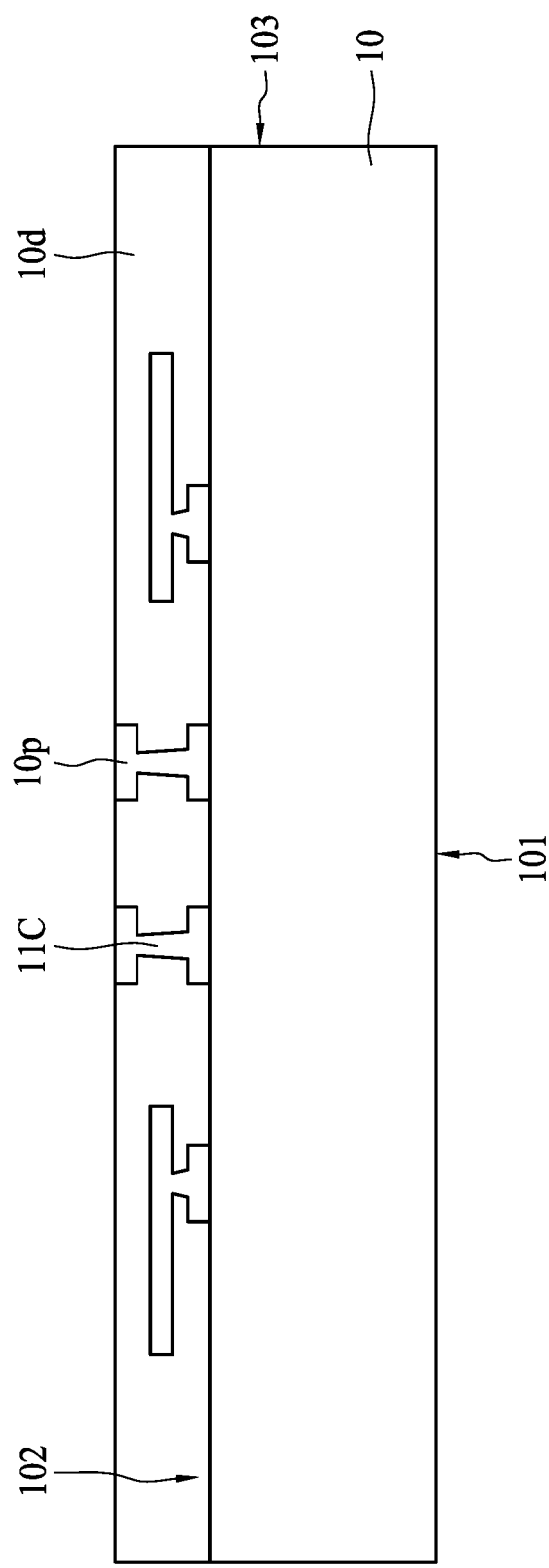
FIG. 3B illustrates one or more stages of a method of manufacturing a semiconductor device package in accordance with some embodiments of the present disclosure.

Referring to FIG. 3B, a plurality of conductive elements 11c are provided on the surface 102 and connected to the conductive pad 10p. A passivation layer 10d is disposed on the surface 102 to fully expose or to expose at least a portion of the conductive elements 11c.

Figure 3C:
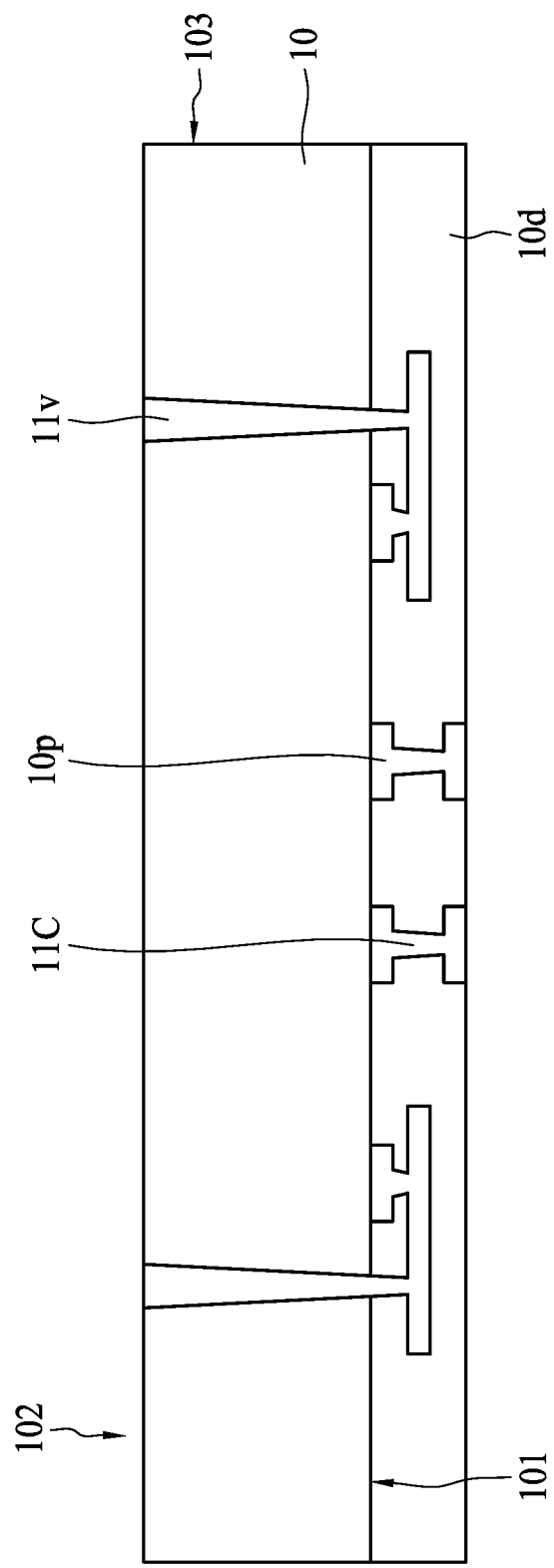
FIG. 3C illustrates one or more stages of a method of manufacturing a semiconductor device package in accordance with some embodiments of the present disclosure.

Afterward, referring to FIG. 3C, a through via 11v is formed in the electronic component 10, and a part of the through via 11v is exposed from the surface 102 of the electronic component 10.

Figure 3D:
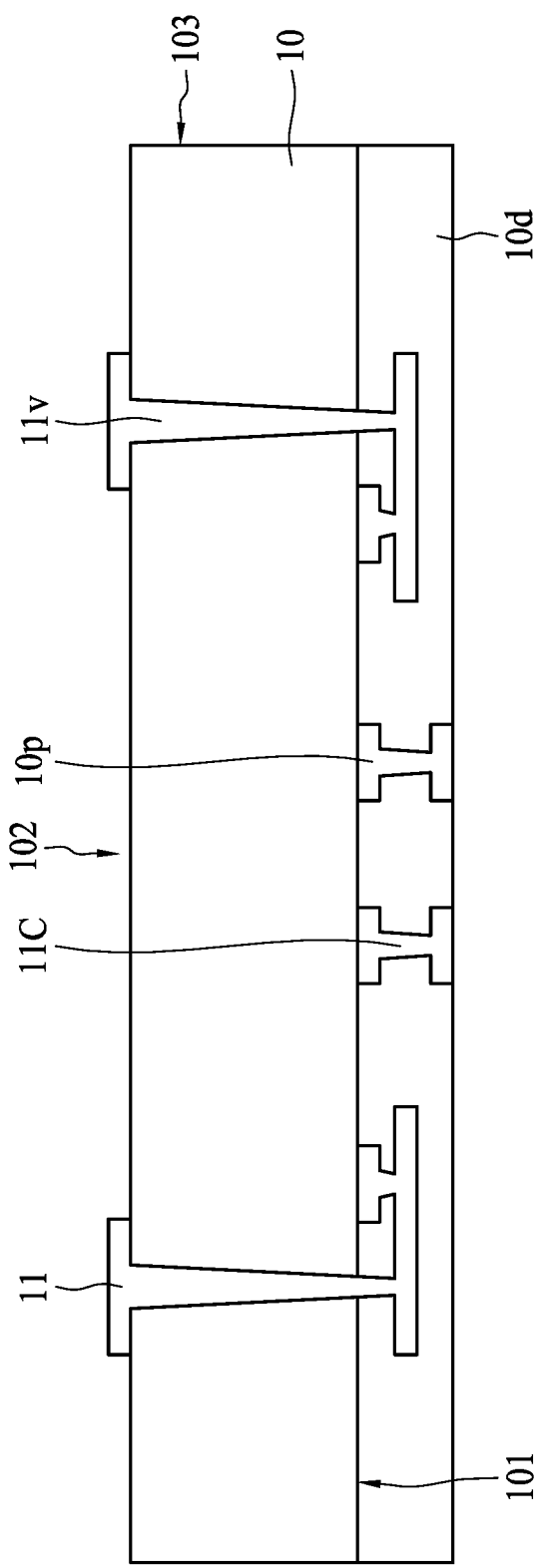
FIG. 3D illustrates one or more stages of a method of manufacturing a semiconductor device package in accordance with some embodiments of the present disclosure.

Referring to FIG. 3D, an antenna layer 11 is disposed on the surface 101 and is connected with the through via 11v. The antenna layer 11 can be formed by, for example but not limited to, plating Au, Ag, Cu, or another metal.

Figure 3E:
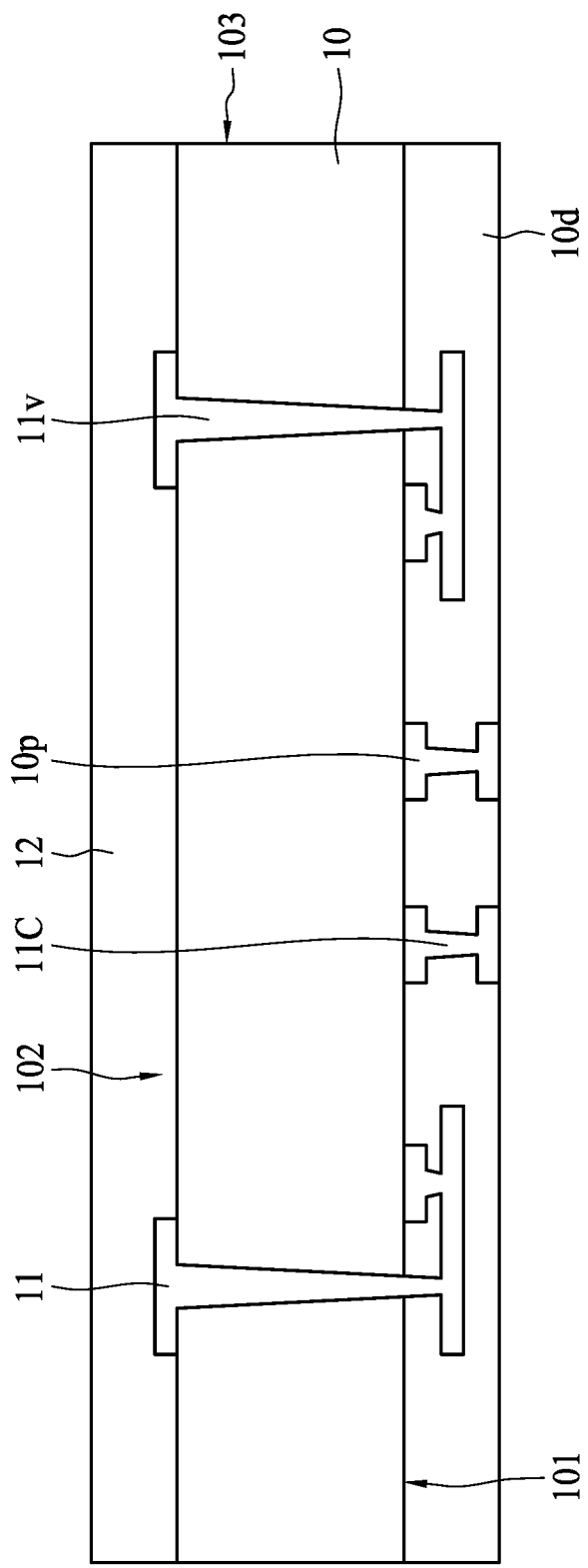
FIG. 3E illustrates one or more stages of a method of manufacturing a semiconductor device package in accordance with some embodiments of the present disclosure.

Referring to FIG. 3E, a dielectric layer 12 is disposed on the surface 101 of the electronic component 10 to cover the antenna layer 11. The dielectric layer 12 can be disposed by, for example, coating, lamination or other suitable processes.

Figure 3F:
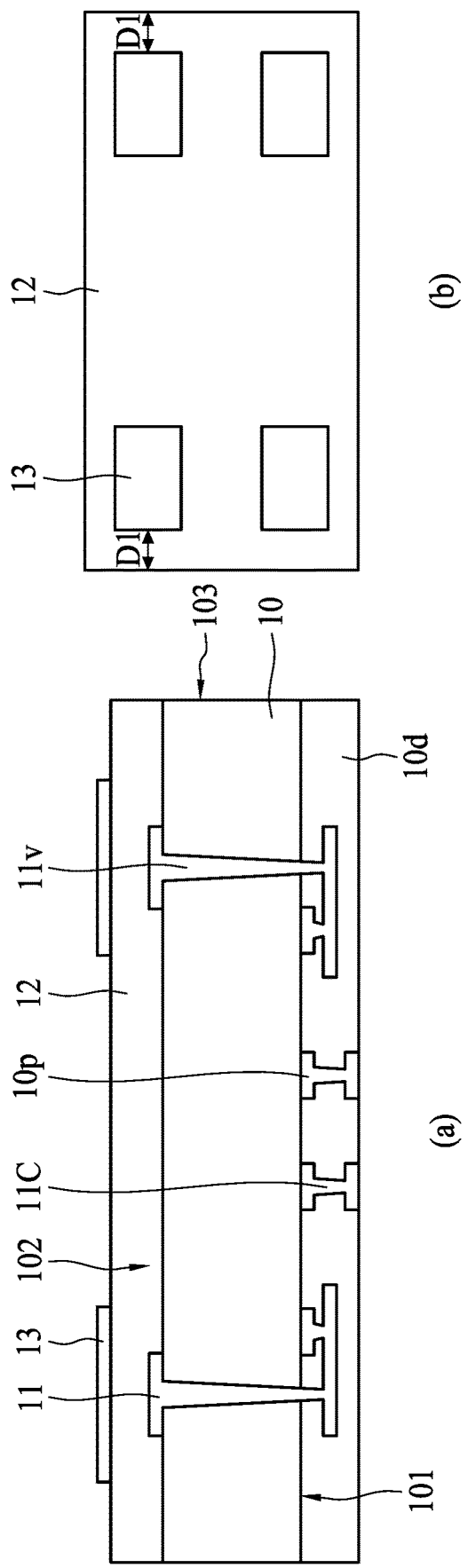
FIG. 3F illustrates one or more stages of a method of manufacturing a semiconductor device package in accordance with some embodiments of the present disclosure.

Subsequently, referring to FIG. 3F, an antenna layer 13 is disposed on dielectric layer 12 to at least partially overlap the antenna layer 11. In some embodiments, the dielectric layer 12 and the antenna layer 13 are provided on the surface 101 of the electronic component 10 before a singulation operation (such as a package saw or dicing operation) performed to separate out individual semiconductor package devices. In such a way, the edge distance criteria D1 (illustrated in the top view (b) of FIG. 3F) can be precisely aligned. On the other hand, if a singulation operation is performed before forming the dielectric layer 12 and the antenna layer 13, the edge distance criteria may be out of design due to the inevitable deviation or stress induced from the singulation operation.

Figure 3G:
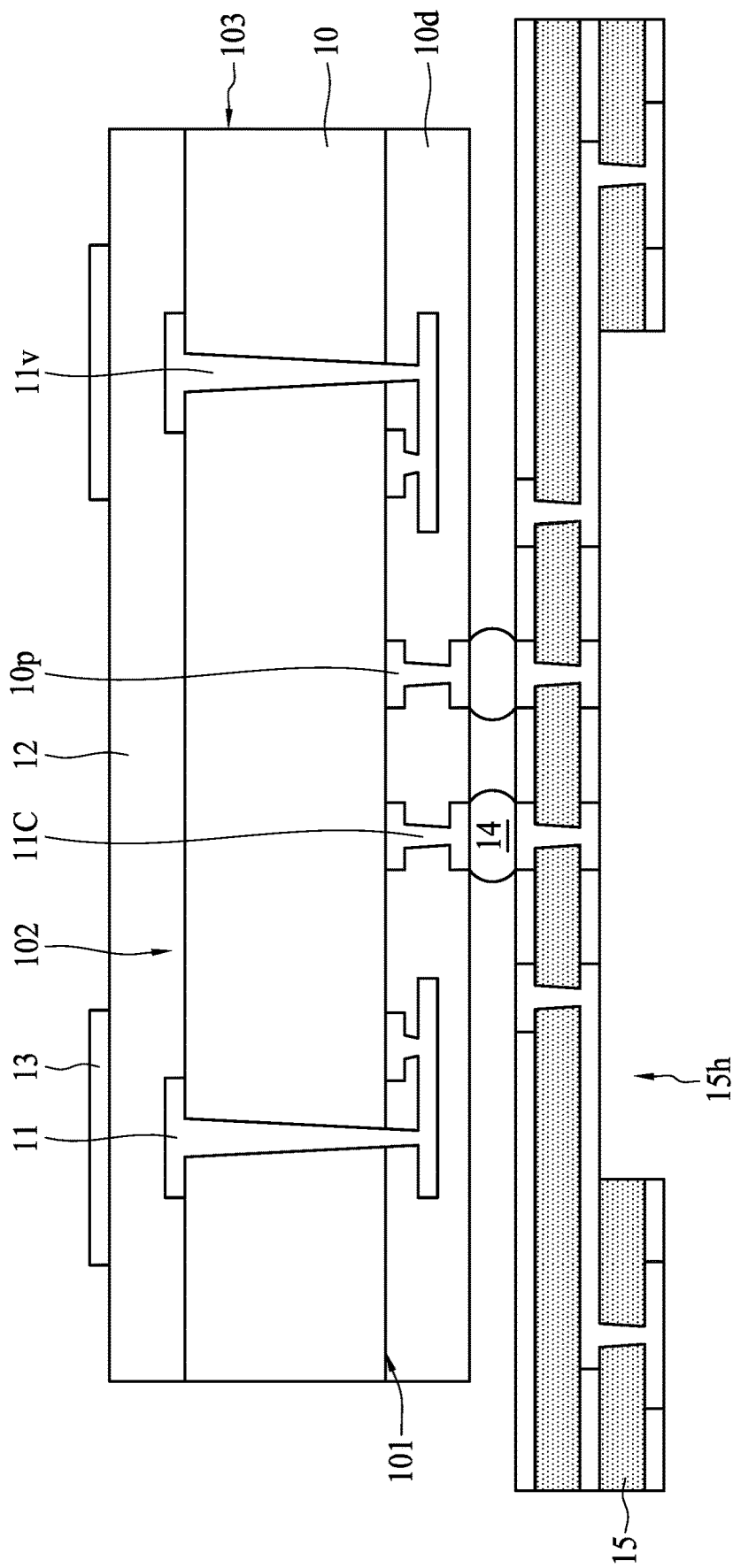
FIG. 3G illustrates one or more stages of a method of manufacturing a semiconductor device package in accordance with some embodiments of the present disclosure.

Then, referring to FIG. 3G, an interconnection structure 15 is electrically connected with the electronic component 10 through an electrical contact 14 provided on the surface 102. The interconnection structure 15 includes a cavity, a hole, or a recessing portion 15h on the side facing away from the electronic component 10.

Figure 3H:
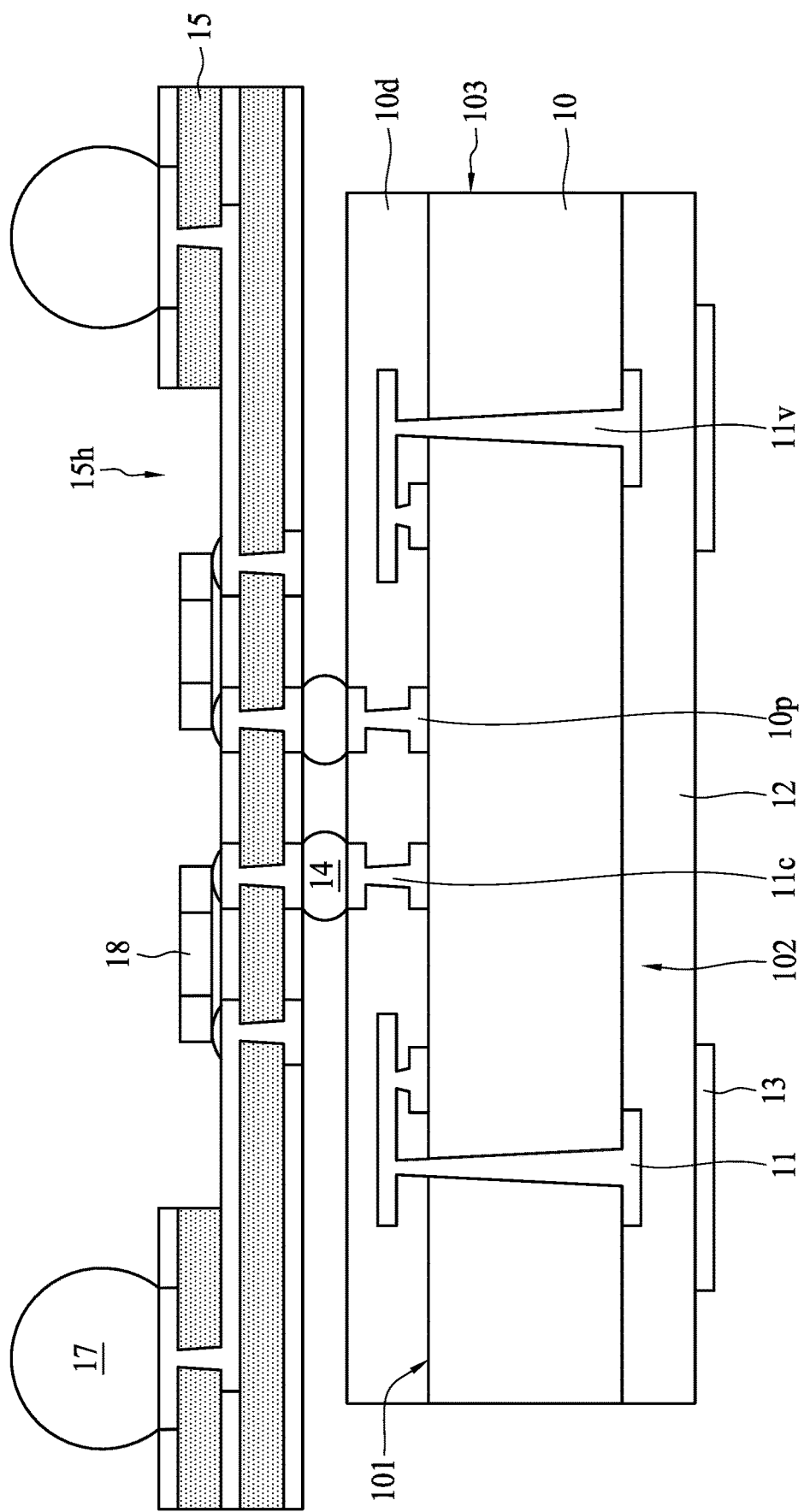
FIG. 3H illustrates one or more stages of a method of manufacturing a semiconductor device package in accordance with some embodiments of the present disclosure.

Next, referring to FIG. 3H, an electronic component 18 can be attached or bonded to the recessing portion 15h of the interconnection structure 15 by mass reflow technique, flip-chip bond technique, or other suitable technique(s). One or more electrical contact(s) 17 can be attached or bonded to the conductive pad on the interconnection structure 15.

A package body (or an encapsulating layer), such as the package body 16 illustrated in FIG. 1, may be formed on the interconnection structure 15 to cover or encapsulate the electronic components 10 and 18. In some embodiments, the package body may be formed by a molding technique, such as transfer molding or compression molding. A singulation operation (e.g., by using a dicing saw, laser, punching machine or other appropriate cutting technique) may be conducted to cut out discrete device package as illustrated in FIG. 1.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
   a first electronic component having an active surface and a backside surface opposite to the active surface;
   a first antenna layer disposed on the backside surface of the first electronic component, wherein the first antenna layer is closer to the backside surface than to the active surface;
   an interconnection structure having a first surface facing the active surface of the first electronic component and a second surface opposite to the first surface of the interconnection structure, wherein the interconnection structure defines a cavity extending from the second surface of the interconnection structure within the interconnection structure; and a second electronic component disposed within the cavity of the interconnection structure, wherein the second electronic component is electrically connected with the active surface of the first electronic component through the interconnection structure.

2. The semiconductor device package of claim 1, further comprising a second antenna layer disposed over the first antenna layer, wherein the first antenna layer is at least partially overlapped with the second antenna layer in a direction substantially perpendicular to the active surface of the first electronic component.

3. The semiconductor device package of claim 1, wherein the first antenna layer is in direct contact with the backside surface of the first electronic component.

4. The semiconductor device package of claim 1, wherein the first antenna layer is substantially planar.

5. The semiconductor device package of claim 1, further comprising:
 a first dielectric layer covering the first antenna layer; and
 a second antenna layer disposed over the first antenna layer and spaced apart from the first antenna layer by the first dielectric layer;
 wherein the first dielectric layer has a first surface in contact with the first antenna layer and the backside surface of the first electronic component, and a second surface opposite to the first surface of the first dielectric layer and in direct contact with the second antenna layer.

6. The semiconductor device package of claim 1, wherein the first electronic component comprises a conductive element adjacent to the active surface and a through via penetrating from the backside surface of the first electronic component to the active surface of the first electronic component, and the conductive element is electrically connected to the first antenna layer by the through via.

7. The semiconductor device package of claim 1, further comprising:
 a package body surrounding a lateral surface of the first electronic component.

8. The semiconductor device package of claim 1, further comprising:
 a second antenna layer disposed over the first antenna layer; and
 a third antenna layer disposed over the second antenna layer and at least partially overlapping the second antenna layer in a direction substantially perpendicular to the active surface of the first electronic component.

9. The semiconductor device package of claim 8, further comprising:
 a first dielectric layer covering the first antenna layer, wherein the second antenna layer is spaced apart from the first antenna layer by the first dielectric layer; and
 a second dielectric layer disposed between the third antenna layer and the second antenna layer, wherein a dielectric constant (Dk) of the second dielectric layer is different from a dielectric constant of the first dielectric layer.

10. The semiconductor device package of claim 9, wherein the dielectric constant of the second dielectric layer is lower than the dielectric constant of the first dielectric layer.

11. The semiconductor device package of claim 10, wherein the first antenna layer is substantially planar.

12. The semiconductor device package of claim 10, wherein the first electronic component comprises a conductive element adjacent to the active surface and a through via penetrating from the backside surface of the first electronic component to the active surface of the first electronic component, and the conductive element is electrically connected to the first antenna layer by the through via.

13. The semiconductor device package of claim 5, further comprising a package body surrounding a lateral surface of the first electronic component, wherein the first antenna layer and the second antenna layer are spaced apart from the package body.

14. The semiconductor device package of claim 5, further comprising a package body surrounding a lateral surface of the first electronic component, wherein the package body surrounds a lateral surface of the first dielectric layer.

15. A semiconductor device package, comprising:
 a first electronic component having an active surface and a backside surface opposite to the active surface;
 a first antenna layer disposed on the backside surface of the first electronic component;
 a first dielectric layer covering the first antenna layer;
 a second antenna layer disposed over the first antenna layer and spaced apart from the first antenna layer by the first dielectric layer;
 an interconnection structure defining a cavity extending from a surface of the interconnection structure within the interconnection structure; and
 a second electronic component disposed within the cavity of the interconnection structure, wherein the second electronic component is electrically connected with the active surface of the first electronic component through the interconnection structure.

\* \* \* \* \*